(12) United States Patent
Yu et al.

(10) Patent No.: US 11,178,858 B2
(45) Date of Patent: Nov. 23, 2021

(54) AQUARIUM

(71) Applicant: GUANGDONG BOYU GROUP CO., LTD, Chaozhou (CN)

(72) Inventors: Youkai Yu, Chaozhou (CN); Bingyan Yu, Chaozhou (CN); Jianqin Yu, Chaozhou (CN)

(73) Assignee: GUANGDONG BOYU GROUP CO., LTD, Chaozhou (CN)

( * ) Notice: Subject to any disclaimer, the term of this patent is extended or adjusted under 35 U.S.C. 154(b) by 317 days.

(21) Appl. No.: 16/268,569

(22) Filed: Feb. 6, 2019

(65) Prior Publication Data

US 2019/0239492 A1  Aug. 8, 2019

(30) Foreign Application Priority Data

Feb. 6, 2018  (CN) .......................... 201820206102.2
Feb. 6, 2018  (CN) .......................... 201820206103.7

(51) Int. Cl.
*A01K 63/06* (2006.01)
*A01K 63/00* (2017.01)
*H05K 5/02* (2006.01)

(52) U.S. Cl.
CPC ............ *A01K 63/06* (2013.01); *A01K 63/003* (2013.01); *A01K 63/006* (2013.01); *H05K 5/0247* (2013.01)

(58) Field of Classification Search
CPC ...... A01K 63/00; A01K 63/04; A01K 63/047; A01K 63/06
USPC ................................ 119/245, 247, 266, 267
See application file for complete search history.

(56) References Cited

U.S. PATENT DOCUMENTS

| 2,712,590 | A | * | 7/1955 | Doble | ...................... H05B 3/80 |
| | | | | | 219/526 |
| 3,895,217 | A | | 7/1975 | Kenneth et al. | |
| 4,026,243 | A | * | 5/1977 | Jessop, III | ........... A01K 63/003 |
| | | | | | 119/246 |
| 4,082,062 | A | * | 4/1978 | Rodemeyer | .......... A01K 63/003 |
| | | | | | 119/262 |
| 4,196,695 | A | * | 4/1980 | Zupo | .................... A01K 63/006 |
| | | | | | 119/253 |
| 4,703,720 | A | * | 11/1987 | Shipman | .............. A01K 63/003 |
| | | | | | 119/261 |
| 5,799,614 | A | * | 9/1998 | Greenwood | ......... A01K 63/065 |
| | | | | | 119/452 |
| 7,527,729 | B2 | * | 5/2009 | Wong | ................... A01K 63/045 |
| | | | | | 119/259 |

(Continued)

FOREIGN PATENT DOCUMENTS

JP    H11 289908 A    10/1999
WO   2015/054967 A1   4/2015

OTHER PUBLICATIONS

Extended European Search Report issued to European counterpart Application No. 19155359.3 by the EPO dated Jul. 3, 2019.

*Primary Examiner* — David J Parsley
(74) *Attorney, Agent, or Firm* — McNees Wallace & Nurick LLC

(57) ABSTRACT

The present disclosure relates to the technical field of aquarium equipment. Disclosed is an aquarium that includes a tank, an electric device disposed in the tank, a first conductive contact configured to be coupled to an external power source, and a second conductive contact coupled to the electric device. The first conductive contact is configured to come into contact with the second conductive contact to power up the electric device.

6 Claims, 9 Drawing Sheets

(56) References Cited

U.S. PATENT DOCUMENTS

| | | | |
|---|---|---|---|
| 8,113,147 B1* | 2/2012 | Wang | A01K 63/06 |
| | | | 119/267 |
| 9,089,115 B2* | 7/2015 | Lari | A01K 63/045 |
| 9,326,494 B2* | 5/2016 | Allen | A01K 63/003 |
| 2014/0223819 A1* | 8/2014 | Coghlan | A01K 63/003 |
| | | | 47/62 R |
| 2015/0250150 A1* | 9/2015 | Lutz | A01K 63/003 |
| | | | 119/248 |

* cited by examiner

AQUARIUM

CROSS-REFERENCES TO RELATED APPLICATIONS

This application claims priority to Chinese patent application Nos. 201820206103.7 filed on Feb. 6, 2018 and 201820206102.2 filed on Feb. 6, 2018, disclosures of which are incorporated herein by reference in their entireties.

TECHNICAL FIELD

The present disclosure relates to the technical field of aquarium equipment, and more specifically, to an aquarium.

BACKGROUND

The progress of the times provides people with more and more space for leisure activities. Keeping pets has become a popular way of entertainment as well as stress relief. Typically people keep fish or other pets in an aquarium, and thus aquariums have become an indispensable piece of furniture or decoration in a home or working environment.

A typical aquarium is usually provided with electric devices such as a water pump, a fixture, a filter, and the like. In the related art, the electric devices in the aquarium are typically such mounted that a power supply wire is directly led from outside the aquarium to inside the aquarium to be coupled to these electric devices. Such aquariums have the following defects.

First, potential safety hazards of electric leakage can occur with the electric devices unless they are powered up by a low safety voltage.

Second, it is rendered extremely inconvenient to move, clean and maintain the aquarium. Because the power supply wire is directly introduced from outside the tank into inside the tank and then coupled to the electric devices, when the aquarium needs to be moved, cleaned or maintained the internal electric devices need first be electrically disconnected from the external power supply wire first disconnected before related operations are possible, and when in reoperation the electric devices would then need to be reconnected to the power supply wire. This leads to quite complicated operations.

Third, the power supply wire would affect the overall aesthetics of the aquarium and would also block the view of viewers' sight of the pets kept in the aquarium when the power supply wire is directly introduced from outside the aquarium to inside the aquarium.

In view of the above problems, there is an urgent need for an aquarium that is safe and convenient for movement, cleaning, and maintenance.

SUMMARY

The object of the present disclosure is to provide an aquarium that is easy to move, clean and maintain, and that is safe to use.

To achieve the object, the present disclosure adopts the technical solutions described below.

An aquarium is provided, including a tank, an electric device disposed in the tank, a first conductive contact coupled to an external power source, and a second conductive contact coupled to the electric device. The first conductive contact is configured to contact the second conductive contact to power up the electric device.

In an exemplary embodiment, a base seat detachably connected to the tank is further included, the electric device is disposed in the tank, the first conductive contact is disposed on the base seat, and the second conductive contact is disposed on the tank. When the tank is mounted on the base seat, the first conductive contact comes into contact with the second conductive contact to power up the electric device.

In an exemplary embodiment, the aquarium further includes an external power line, the base seat includes a tank mount and an external power source connection seat connected to the tank mount. The tank mount is configured for placing the tank, and the first conductive contact is disposed on the external power source connection seat and is configured to be coupled to the external power line.

In an exemplary embodiment, the tank includes a tank body and a tank cover connected to the tank body, the electric device is fixedly connected to a bottom of the tank body through a connecting member, and the second conductive contact is disposed in a second contact mount at the bottom of the tank body, is connected to an end of the connecting member facing away from the electric device, and extends through the bottom of the tank body to an outside of the tank. The external power source connection seat is disposed under the tank mount, and the tank mount is provided with a through hole configured for the second conductive contact to pass through.

In an exemplary embodiment, the connecting member includes a connecting tube and a connecting wire disposed in the connecting tube. The connecting member has one end connected to the electric device and another end connected to the tank body, and the connecting wire has one end coupled to the electric device and another end coupled to the second conductive contact.

In an exemplary embodiment, a bottom of the tank mount is concavely provided with a mounting slot that faces towards the tank. The power source connection seat is fixedly mounted in the mounting slot, and a bottom of the external power source connection seat is flush with the bottom of the tank mount.

In an exemplary embodiment, the tank includes a tank body and a tank cover which is disposed to cover on the tank body, the second conductive contact is disposed on the tank cover, and the electric device is mounted on the tank cover. The external power source connection seat is disposed on one side of the base seat along a circumference of the base seat, and the first conductive contact comes into contact with the second conductive contact when the tank cover is arranged to cover on the tank body mounted on the tank mount.

In an exemplary embodiment, the external power source connection seat includes a protective casing having a first contact mount configured for mounting the first conductive contact. The external power line extends into inside the protective casing to be coupled to the first conductive contact, and a protective hole configured for the second conductive contact to pass through is defined in the protective casing at a position corresponding to the first conductive contact.

In an exemplary embodiment, the protective casing has a fixing clamp for fixing the external power line.

Typically, the external power source connection seat further includes a bottom cover plate detachably fixed to the bottom of the protective casing.

In an exemplary embodiment, the protective casing or the bottom cover plate is provided with a water draining hole.

In an exemplary embodiment, the electric device is detachably connected to the tank, the tank includes a tank body and an external power source connection seat detachably connected to the tank body, and the first conductive contact is disposed on the external power source connection seat. When the electric device is connected to the tank, the first conductive contact comes into contact with the second conductive contact to power up the electric device.

In an exemplary embodiment, the tank further includes a tank cover that is optionally coverable on the tank body. The external power source connection seat is disposed on the tank cover. The first conductive contact is disposed to face toward one side of the tank body, the electric device is connected to a sidewall of the tank body through a first fixing member and extends in the direction of the tank cover, the second conductive contact is disposed to face toward the tank cover, and the first conductive contact comes into contact with the second conductive contact when the tank cover is covered on the tank body.

In an exemplary embodiment, the first fixing member includes an insert slot defined in the sidewall of the tank body and an insert plate fixedly connected to the electric device. The insert plate has one end connected to the electric device and another end that extends toward the tank body and that is insertable into inside the insert slot thus fixing the electric device onto the tank body.

In an exemplary embodiment, the first fixing member further includes a first limiting plate that is connected to the electric device at one end and that extends toward the tank body at another end. The insert plate is spaced apart from the first limiting plate. The insert slot is formed on an inner sidewall of the tank body, and the insert plate and the first limiting plate forms an insertive slot configured to be insertively fitted with the sidewall of the tank body.

In an exemplary embodiment, a limiting buckle is disposed at an end of the first limiting plate facing away from the electric device and is arranged to face toward the sidewall of the tank body. The sidewall of the tank body is provided with a limiting hole disposed corresponding to a position of the limiting buckle. The limiting buckle can be inserted into the limiting hole to be fastened to the sidewall of the tank body.

In an exemplary embodiment, the tank cover abuts against the tank body through a cover body limiting member. The cover body limiting member includes a limiting protrusion disposed on the outer sidewall of the tank body and a limiting groove defined in the tank cover. The limiting groove includes a second guide surface, and the limiting protrusion is inserted into the limiting groove through the second guide surface.

In an exemplary embodiment, the external power source connection seat is mounted on the outer sidewall of the tank body, and is connected to the electric device and the tank body through a second fixing member. The second fixing member includes a connecting plate fixedly connected to the electric device and two second limiting plates respectively connected to two ends of the connecting plate. The two second limiting plates are disposed on a side of the connecting plate facing away from the electric device, and form a limiting slot therebetween. The second conductive contact extends through the connecting plate to a slot bottom of the limiting slot and further protrudes form the slot bottom. The tank body and the external power source connection seat are both snap-fitted with the limiting slot, and the first conductive contact is disposed on the external power source connection seat.

In an exemplary embodiment, the tank further includes a base seat on which the tank body is detachably mounted, the external power source connection seat is disposed on one side of the tank body and is connected to the base seat, the electric device is detachably fixed to an upper end of the tank body through a third fixing member, an end of the third fixing member facing away from the electric device extends to the external power source connection seat, the second conductive contact is disposed on an end of the third fixing member that directly faces the external power source connection seat, and the electric device is detachably connected to a sidewall of the tank body.

In an exemplary embodiment, the third fixing member includes a fixing portion connected to the electric device, the fixing portion is provided with an insertive slot corresponding to a sidewall of the tank body, and the sidewall of the tank body is mated with the insertive slot.

In an exemplary embodiment, the aquarium further includes an external power line, the external power source connection seat includes a protective casing having a first contact mount for mounting the first conductive contact, the external power line extends into inside the protective casing to be coupled to the first conductive contact, and the protective casing is provided with a protective hole configured for the second conductive contact to pass through at a position corresponding to the first conductive contact.

The present disclosure provides the following beneficial effects.

With the arrangement of the first conductive contact and second conductive contact, the electric device and the external power line are not fixedly connected, which facilitates the movement, cleaning and maintenance of the aquarium, making the aquarium safer and more reliable when in use.

When the tank is mounted on the base seat, the second conductive contact comes into contact with the first conductive contact such that the electric device is powered up and can work properly. When the tank is detached from the base seat, the second conductive contact would be separated from the first conductive contact such that the electric device would be powered off and stop working. With this design, the electric device can be conveniently controlled to be powered on and off, and the aquarium is convenient to move, clean and maintain. In addition, since the second conductive contact is disposed on the base seat while the first conductive contact is disposed on the tank, and the second conductive contact is operative to contact the first conductive contact to achieve an electrical connection, the connecting cable avoid being directly pulled from outside the tank to inside the tank to be electrically connected to the electric device. This avoids the risk of electric leakage, ensures the safety of use of the aquarium, and also improves the overall aesthetics of the aquarium.

Because the external power source connection seat is detachably connected to the tank body or is separated from the tank body, the tank body can be separately moved. Also because the electric device is detachably connected to the tank, the electric device may be separated from the tank. With this design, the tank body can be disconnected from the external power source and the tank body and can be separately taken out thereby facilitating the movement, cleaning or maintenance of the tank body. By making first conductive contact the second conductive contact to turn on the electrical connection of the electric device, the electric device can be conveniently controlled. Furthermore, by making the first conductive contact and the second conductive contact to contact each other, the connecting wire can avoid being directly pulled from outside the tank body to the electric device and then being arranged on the sidewall of the tank body, which would adversely affect the overall aesthetics of the aquarium. In addition, this can prevent people's sight of the pets kept inside the tank body from being blocked by the connecting wire.

BRIEF DESCRIPTION OF DRAWINGS

In FIGS. 1 and 2:

| | |
|---|---|
| 11. Tank; | 111. Second Conductive Contact; |
| 112. Second Contact Mount; | 113. Tank Body; |
| 12. Electric Device; | 13. Base Seat; |
| 131. First Conductive Contact; | 132. Tank Mount; |
| 133. External Power Source Connection Seat; | 1331. Water Draining Hole; |
| 1332. First Contact Mount; | 1333. Bottom Cover Plate; |
| 1334. Fixing Clamp; | 1335. Protective Casing; |
| 14. External Power Line; | 15. Connecting Member; |
| 151. Connecting Tube; | 152. Connecting Wire. |

Figure 3:
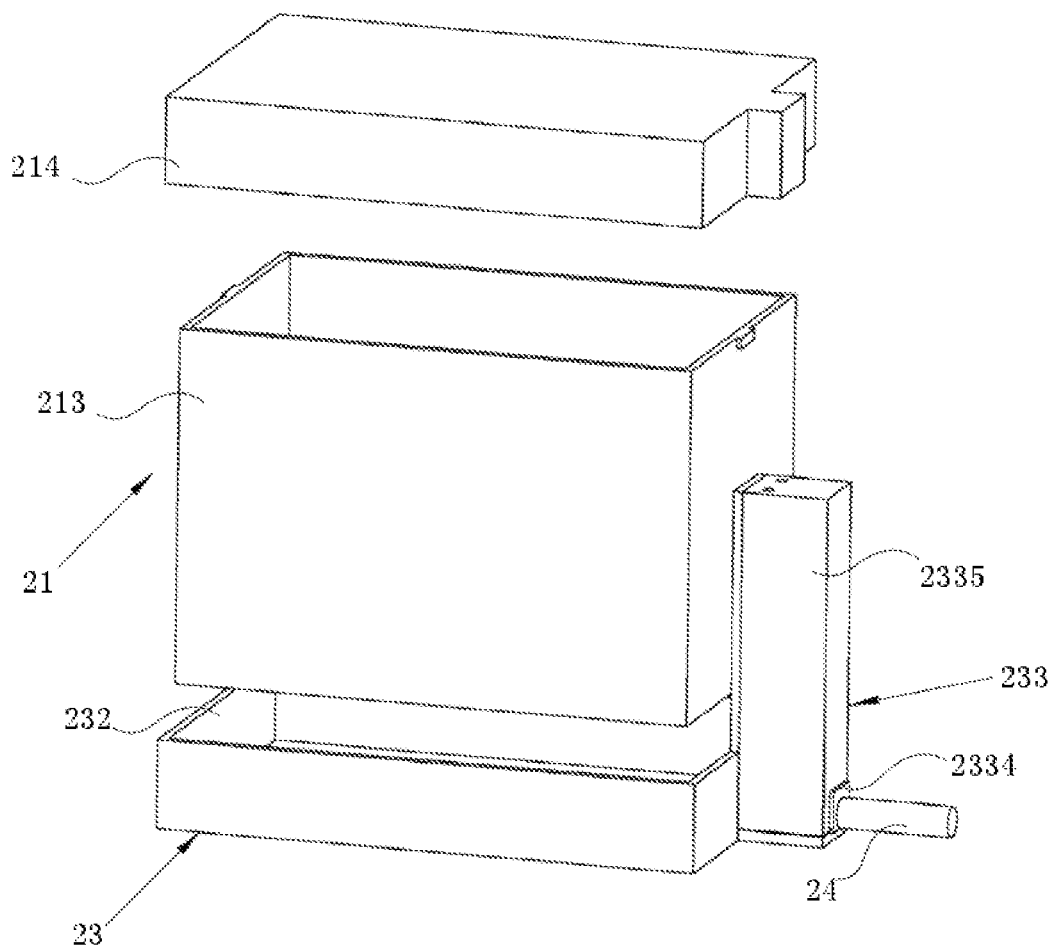
FIG. 3 is a perspective view of an aquarium according to an embodiment 2.
Figure 4:
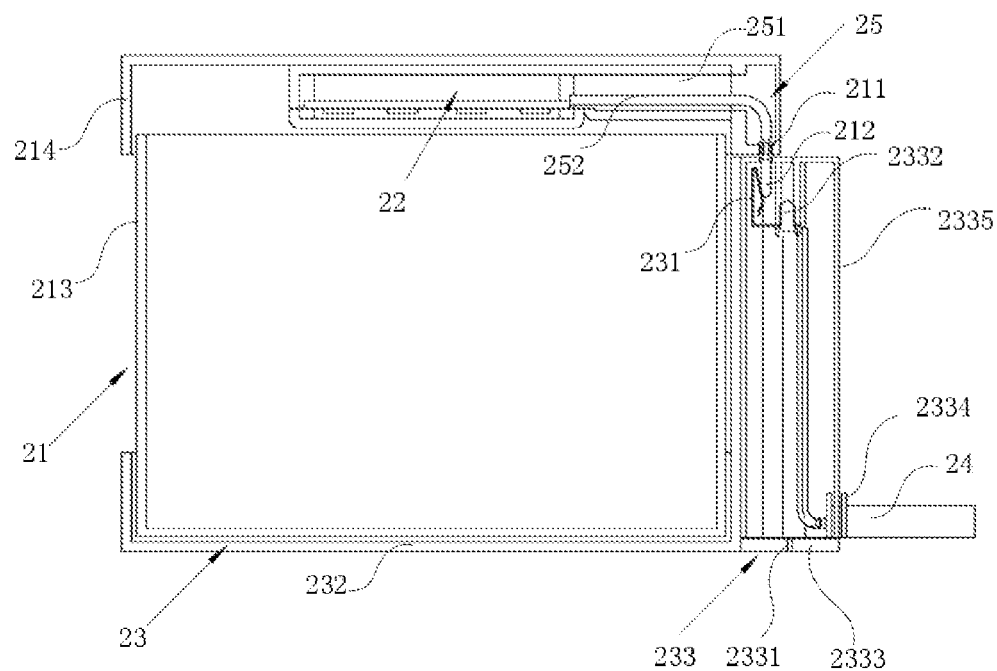
FIG. 4 is a schematic diagram showing an internal structure of the aquarium according to the embodiment 2.
Figure 5:
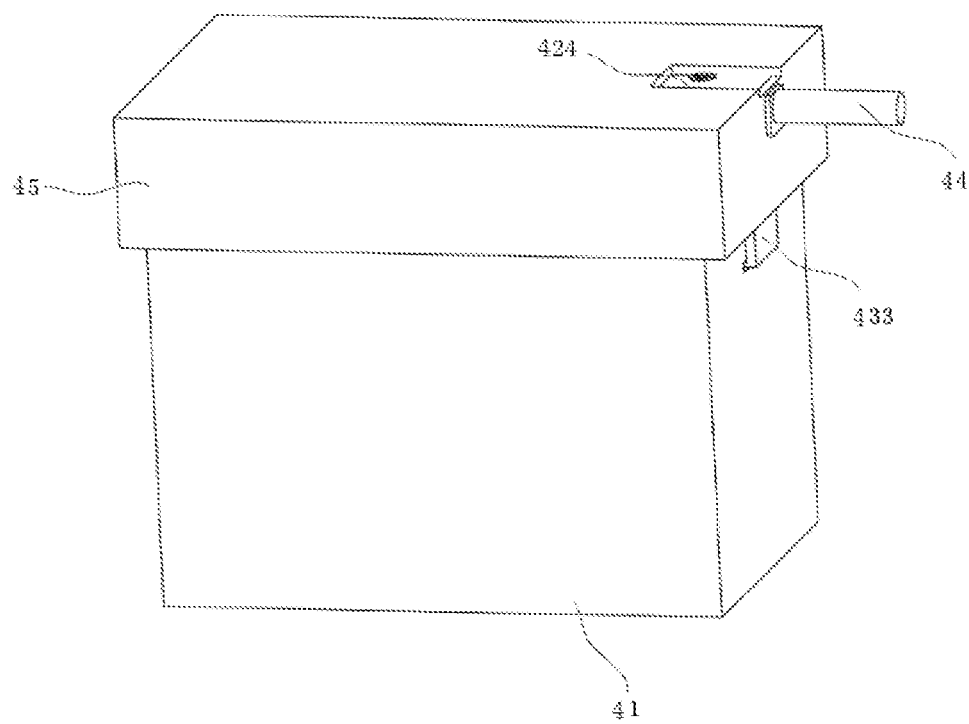
FIG. 5 is a perspective view of an aquarium according to an embodiment 3.
Figure 6:
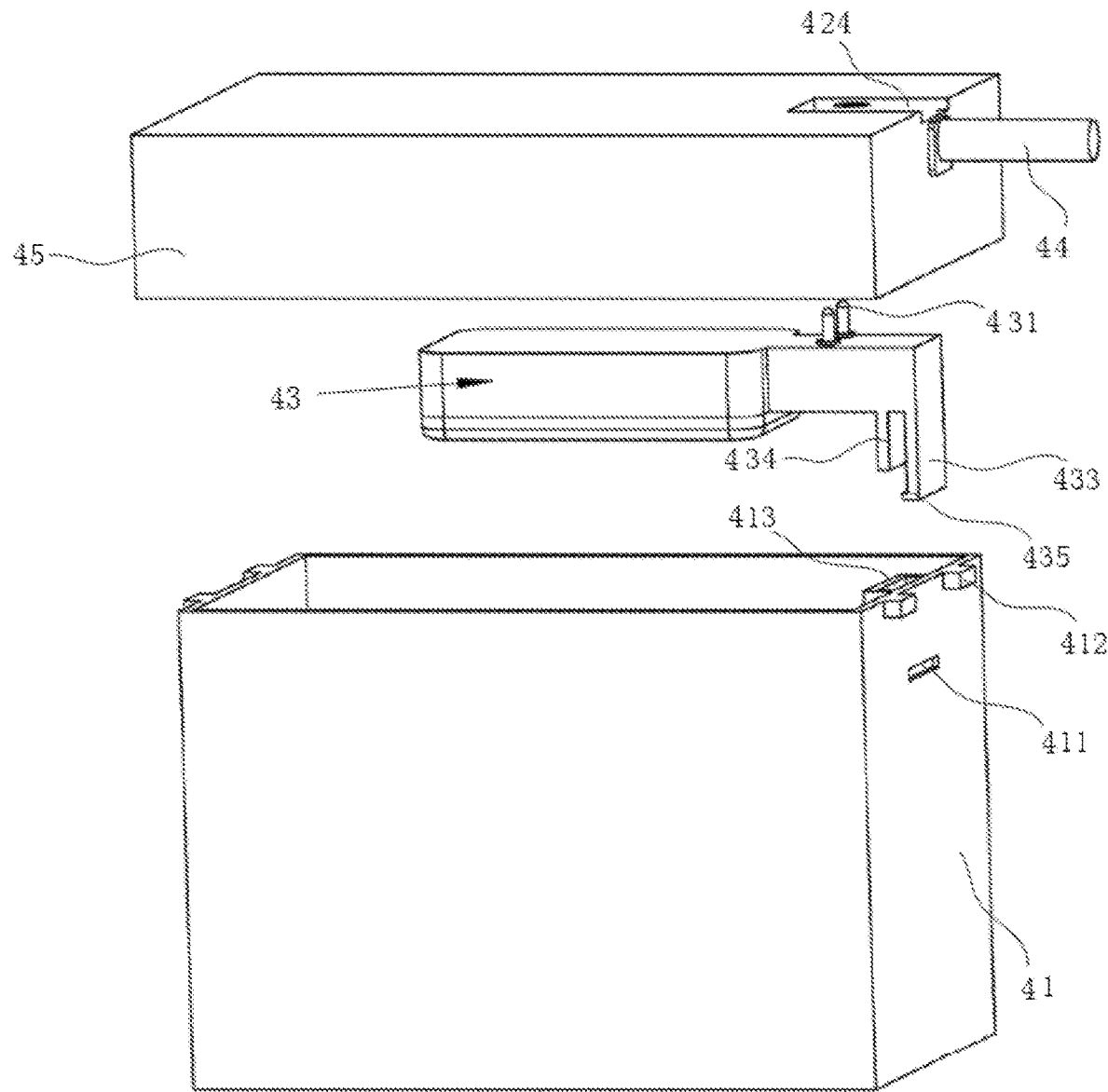
FIG. 6 is an exploded view of the aquarium according to the embodiment 3.
Figure 7:
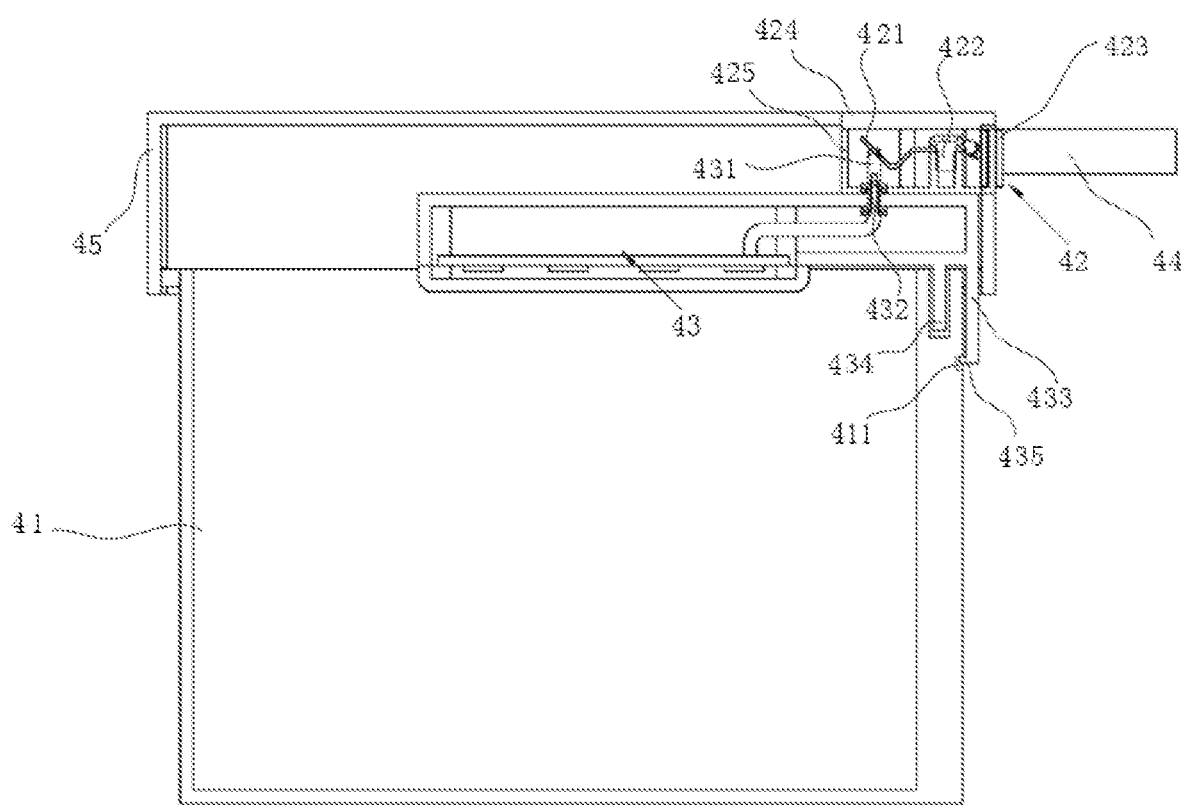
FIG. 7 is a sectional view of the aquarium according to the embodiment 3.
Figure 8:
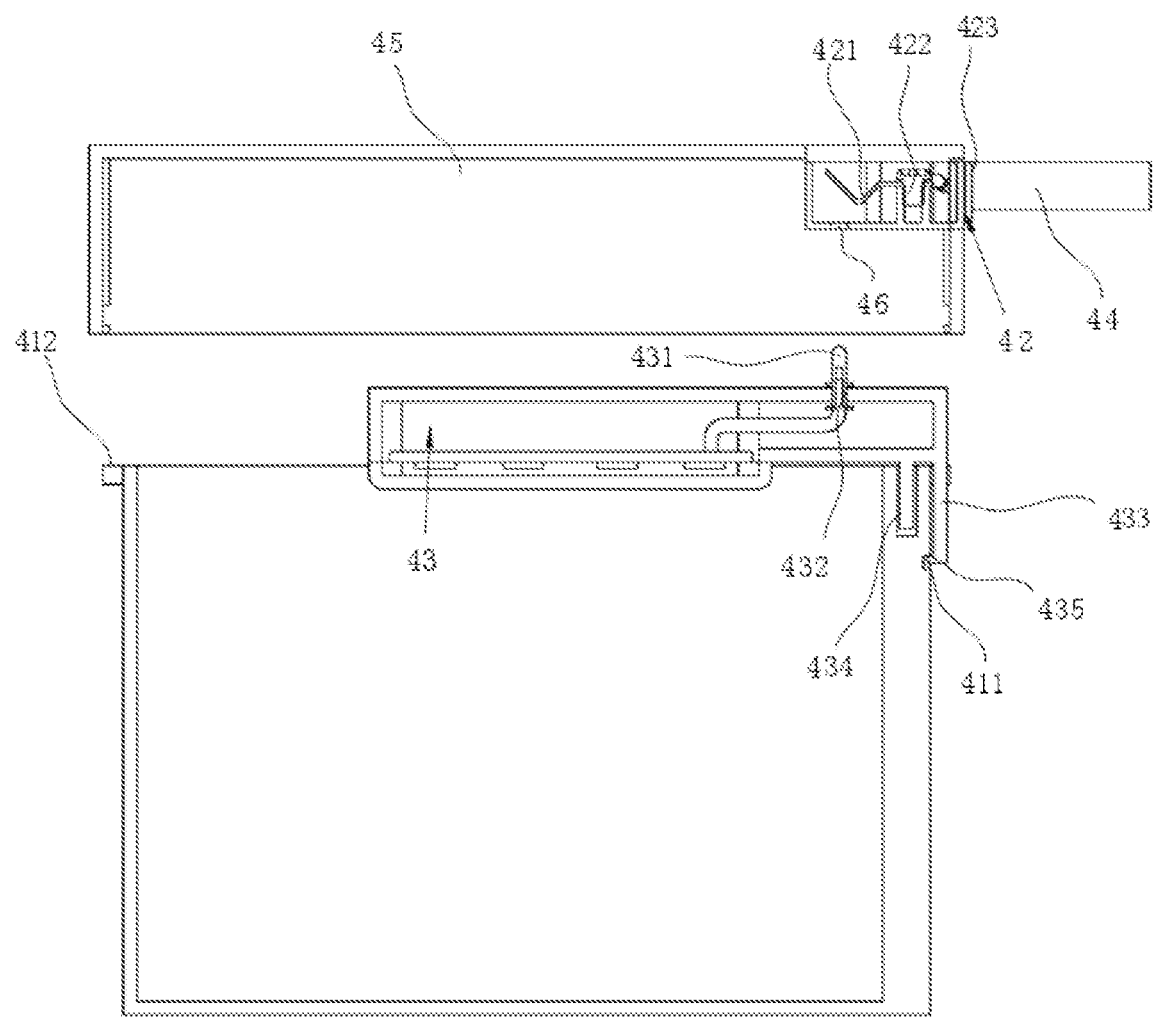
FIG. 8 is a sectional view showing a cover body and tank body of the aquarium in a non-covered state according to the embodiment 3.

In FIGS. 3 and 4:

| | |
|---|---|
| 21. Tank; | 211. Second Conductive Contact; |
| 212. Second Contact Mount; | 213. Tank Body; |
| 22. Electric Device; | 23. Base Seat; |
| 231. First Conductive Contact; | 232. Tank Mount; |
| 233. External Power Source Connection Seat; | 2331. Water Draining Hole; |
| 2332. First Contact Mount; | 2333. Bottom Cover Plate; |
| 2334. Fixing Clamp; | 2335. Protective Casing; |
| 24. External Power Line; | 25. Connecting Member; |
| 251. Connecting Tube; | 252. Connecting Wire. |

In FIGS. 5 to 8:

| | |
|---|---|
| 41. Tank Body; | 411. Limiting Hole; |
| 412. Limiting Protrusion; | 413. Insert Slot; |
| 42. External Power Source Connection Seat; | 421. First Conductive Contact; |
| 422. First Contact Mount; | 423. Fixing Clamp; |
| 424. Bottom Cover Plate; | 425. Protective Casing; |

-continued

| | |
|---|---|
| 43. Electric Device; | 431. Second Conductive Contact; |
| 432. Second Contact Mount; | 433. First Limiting Plate; |
| 434. Insert Plate; | 435. Limiting Buckle; |
| 44. External Power Line; | 45. Tank Cover; |
| 46. Protective Hole. | |

Figure 9:
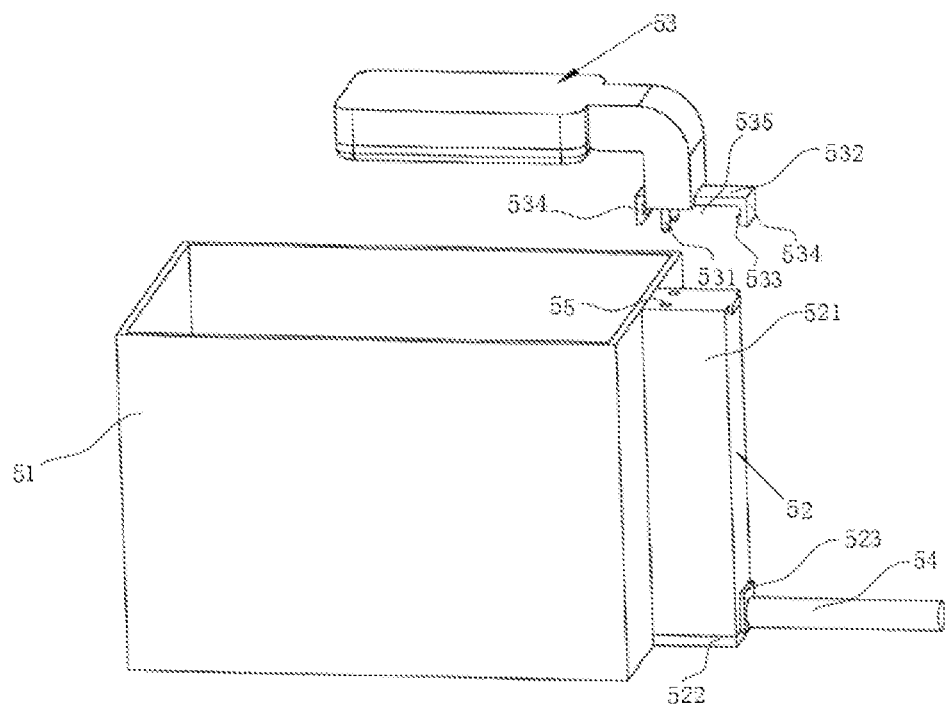
FIG. 9 is a perspective view of an aquarium according to an embodiment 4.
Figure 10:
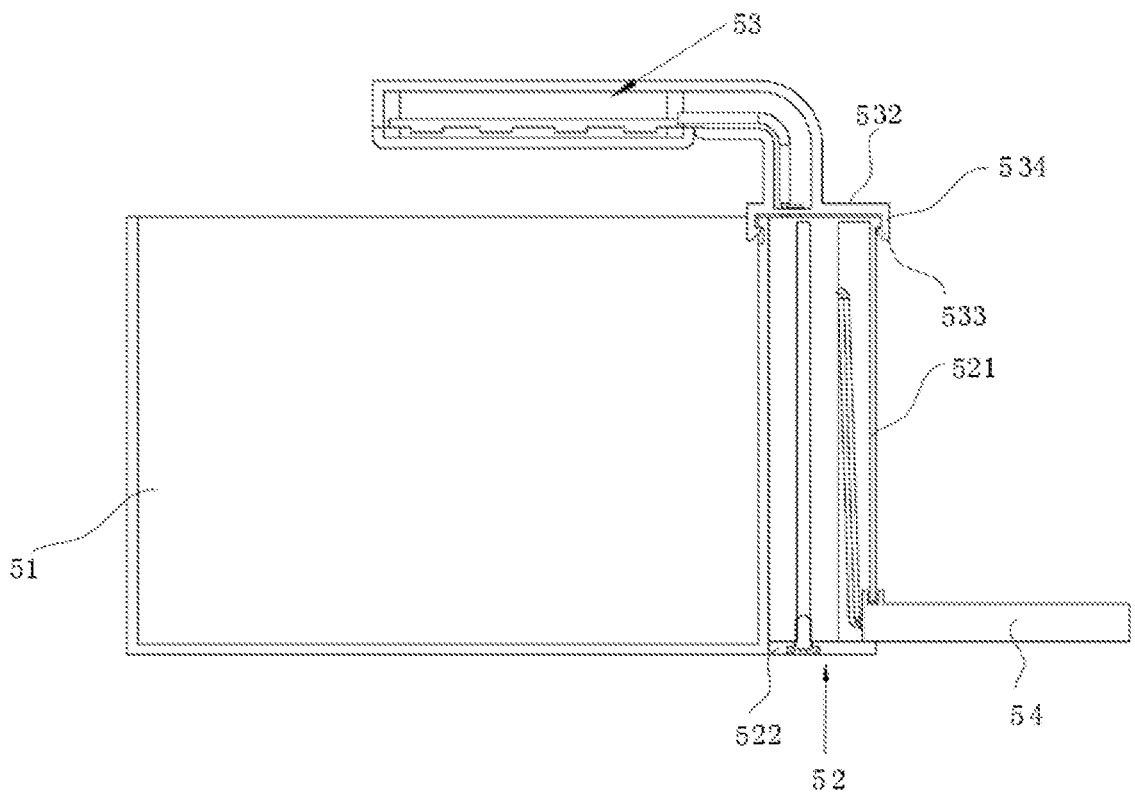
FIG. 10 is a sectional view of the aquarium according to the embodiment 4.

In FIGS. 9 and 10:

| | |
|---|---|
| 51. Tank Body; | 52. External Power Source Connection Seat; |
| 521. Protective Casing; | 522. Bottom Cover Plate; |
| 523. Fixing Clamp; | 53. Electric Device; |
| 531. Second Conductive Contact; | 532. Connecting Plate; |
| 533. Clamp; | 534. Second Limiting Plate; |
| 535. Limiting Slot; | 54. External Power Line; |
| 55. Protective Hole. | |

Figure 11:
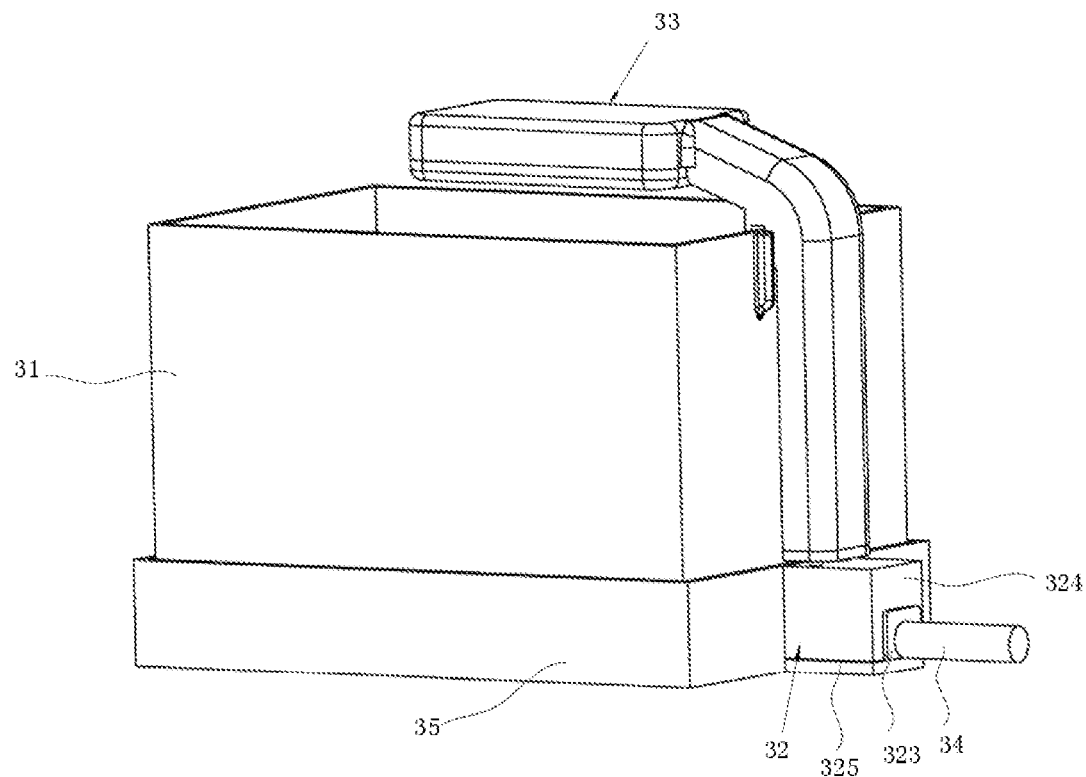
FIG. 11 is a perspective view of an aquarium according to an embodiment 5.
Figure 12:
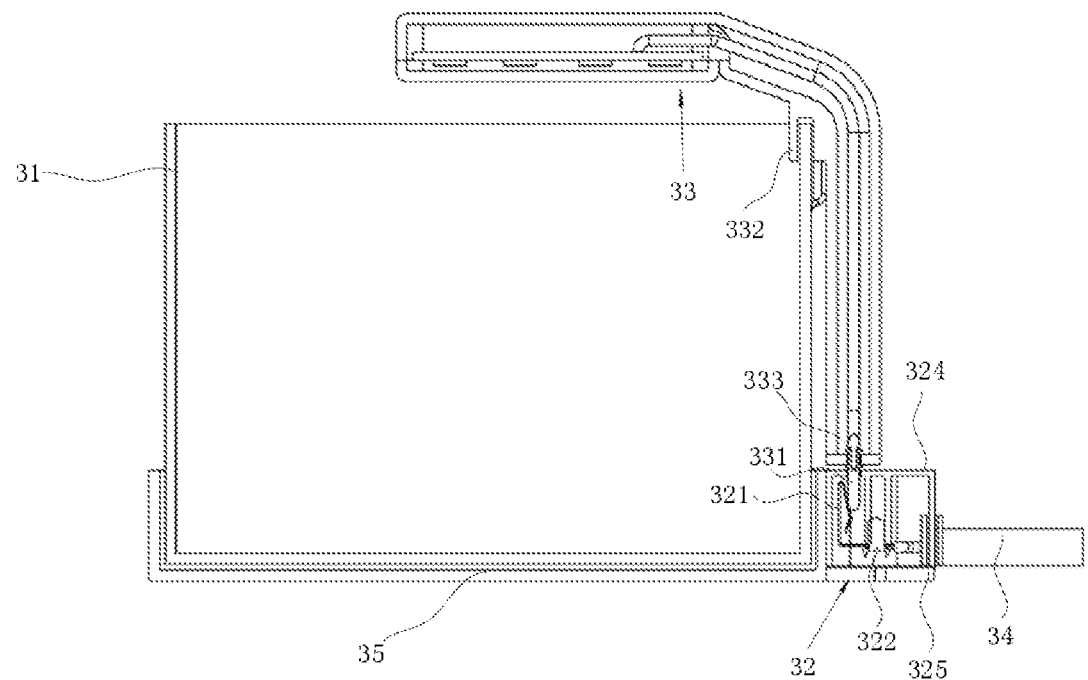
FIG. 12 is a sectional view of the aquarium according to the embodiment 5.

In FIGS. 11 and 12:

| | |
|---|---|
| 31. Tank Body; | 32. External Power Source Connection Seat; |
| 321. First Conductive Contact; | 322. First Contact Mount; |
| 323. Fixing Clamp; | 324. Protective Casing; |
| 325. Bottom Cover Plate; | 33. Electric Device; |
| 331. Second Conductive Contact; | 332. Fixing Portion; |
| 333. Second Contact Mount; | 34. External Power Line; |
| 35. Base Seat. | |

DETAILED DESCRIPTION

Embodiments in accordance with the present disclosure will now be described in detail below. Examples of the embodiments are illustrated in the drawings, where the same or similar reference numerals indicate the same or similar elements or elements having the same or similar functions. The embodiments described below with reference to the drawings are merely exemplary; they are intended to explain the present disclosure, and are not to be construed as limiting the present disclosure.

Unless otherwise expressly specified and defined, the term "connected to each other", "connected" or "fixed" is to be construed in a broad sense, for example, as permanently connected, detachably connected, or integrated; mechanically connected or electrically connected; directly connected to each other or indirectly connected to each other via an intermediary; or internally connected or interactional between two components. For those of ordinary skill in the art, the above terms can be construed depending on specific contexts.

In the present disclosure, unless otherwise expressly specified and defined, when a first feature is described as "above" or "below" a second feature, the first feature and the second feature may be in direct contact, or be in contact via another feature between the two features. Moreover, when the first feature is described as "on", "above" or "over" the second feature, the first feature is directly on, above or over the second feature or the first feature is obliquely on, above or over the second feature, or the first feature is at a higher level than the second feature. When the first feature is described as "under", "below" or "underneath" the second feature, the first feature is directly under, below or underneath the second feature or the first feature is obliquely under, below or underneath the second feature, or the first feature is at a lower level than the second feature.

The technical solutions of the present disclosure will be further described below through specific embodiments in conjunction with the drawings.

Embodiment 1

Figure 1:
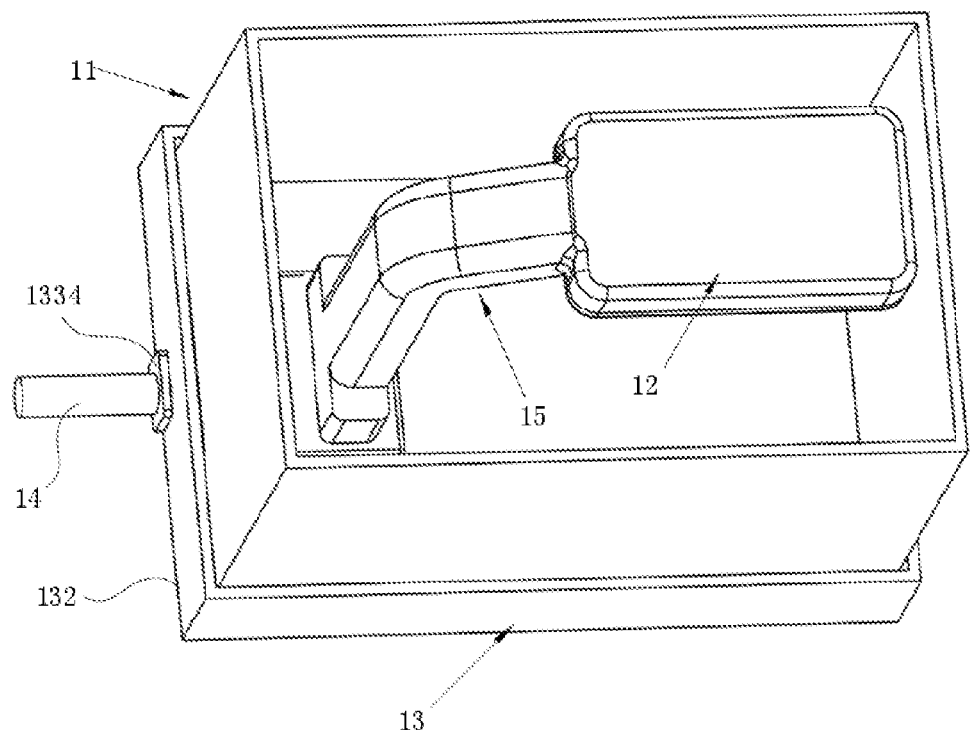
FIG. 1 is a perspective view of an aquarium according to an embodiment 1.
Figure 2:
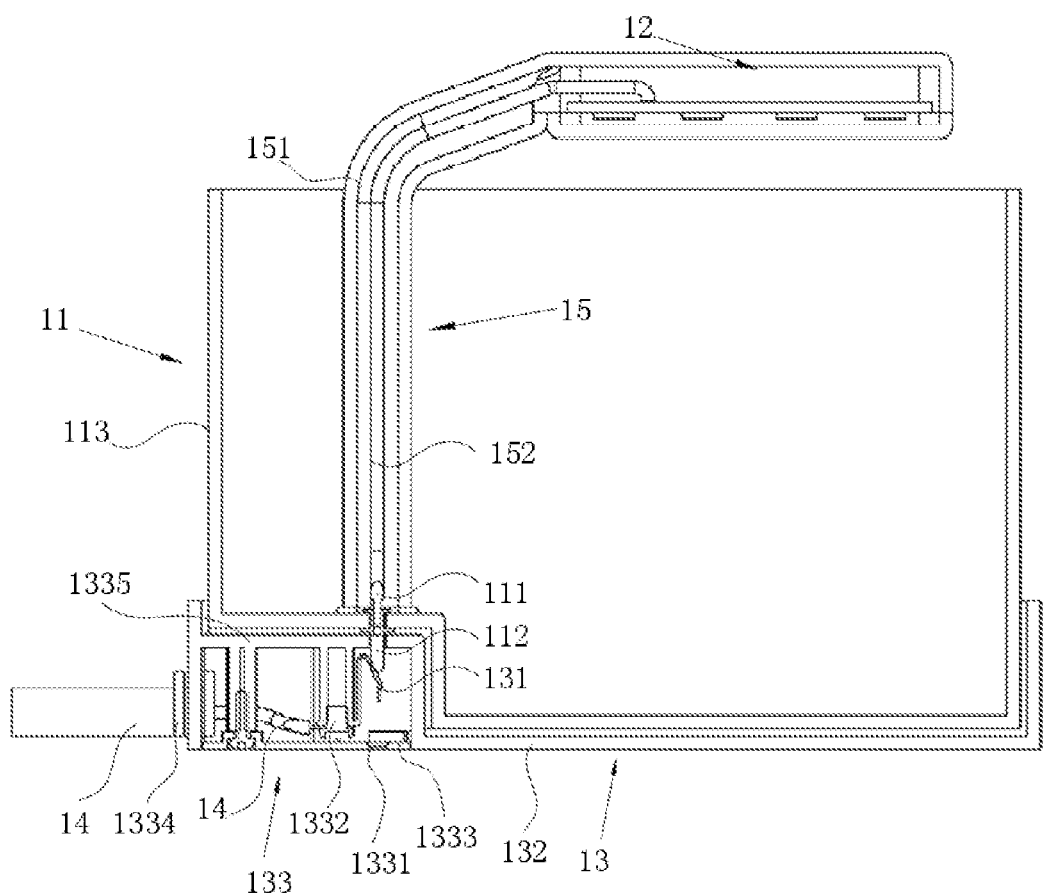
FIG. 2 is a schematic diagram showing an internal structure of the aquarium according to the embodiment 1.

As illustrated in FIGS. 1 and 2, an embodiment of the present disclosure provides an aquarium. The aquarium includes a tank 11, an electric device 12 disposed in the tank 11, and a base seat 13 detachably connected to the tank 11. The base seat 13 is provided with a first conductive contact 131 coupled to an external power line 14, and the tank 11 is provided with a second conductive contact 111 coupled to the electric device 12. When the tank 11 is mounted on the base seat 13, the first conductive contact 131 comes into contact with the second conductive contact 111 to power up the electric device 12.

The first conductive contact 131 is disposed on the base seat 13. When the tank 11 is mounted on the base seat 13, the first conductive contact 131 comes into contact with the second conductive contact 111, such that the electric device 12 can work normally. When the tank 11 is detached from the base seat 13, the first conductive contact 131 is separated from the second conductive contact 111, such that the electric device 12 would be powered off and stop working. With this design, when the tank 11 needs to be removed or needs to be moved, cleaned or maintained, the tank 11 can be directly detached from the base seat 13, so that the circuitry of the electric device 12 is cut off. This facilitates the cleaning and maintenance. In addition, since the first conductive contact 131 is disposed on the base seat 13, the second conductive contact 111 is disposed on the tank 11, and the first conductive contact 131 comes into contact with the second conductive contact 111 to turn on the electrical connection, the connecting wire 152 can avoid being directly pulled from outside the tank 11 to inside the tank 11 to be electrically connected to the electric device 12, thereby avoiding the risk of electric leakage and ensuring the safety of use of the aquarium is ensured. Because the connecting wire 152 is not directly pulled from outside the tank 11 to inside the tank 11, people's view of the pets kept in the aquarium can avoid being blocked by the connecting wire 152, thereby improving the overall aesthetics of the aquarium.

The base seat 13 includes a tank mount 132 and an external power source connection seat 133 connected to the tank mount 132 which is used for placing the tank 11. The first conductive contact 131 is disposed on the external power source connection seat 133 and is coupled to the external power line 14. By providing the tank mount 132, the tank body 11 may be directly placed on the base seat 13, which is convenient for use. Specifically, the periphery of the tank mount 132 is provided with a surrounding plate, and a tank mounting position is formed by the surrounding plate to prevent the tank 11 from being displaced on the tank mount 132. By disposing the first conductive contact 131 on the external power source connection seat 133, the tank 11 is convenient to be fixedly mounted.

The tank 11 includes a tank body 113 and a tank cover (not illustrated in the figure) connected to the tank body 113, and the electric device 12 is fixedly connected to a bottom of the tank body 113 through a connecting member 15. The second conductive contact 111 is disposed in a second contact mount 112 at the bottom of the tank body 113, is connected to an end of the connecting member 15 facing away from the electric device 12, and extends through the bottom of the tank body 113 to outside the tank 11.

The external power source connection seat 133 is disposed below the tank mount 132, and the tank mount 132 is provided with a through hole for the second conductive contact 111 to pass through. In use, since the electric device 12 is fixedly connected to the bottom of the tank body 113 through the connecting member 15, the second conductive contact 111 can be disengaged from the first conductive contact by detaching the tank body 113 from the base seat 13. Thus, the electric device 12 would be powered off.

The connecting member 15 includes a connecting tube 151 and a connecting wire 152 disposed in the connecting tube. The connecting member 15 has one end connected to the electric device 12 and the other end connected to the tank body 113, and the connecting wire 152 has one end coupled to the electric device 12 and the other end coupled to the second conductive contact 111. Specifically, the electric device 12 is connected to the second conductive contact 111 with the connecting line 152 passing through the inside of the connecting tube 151, so that the wire is sealed in the connecting tube 151 to prevent electric leakage due to contact with water in the tank body 113, thereby further improving the safety performance of the aquarium. In actual use, the second conductive contact 111 comes into contact with the first conductive contact 131 via the through hole, and then the circuitry of the electric device 12 would be powered on and enabled to work normally.

In the embodiment, a bottom of the tank mount 132 is concavely provided with a mounting slot that faces toward the tank 11. The external power source connection seat 133 is fixedly mounted in the mounting slot, and a bottom of the external power source connection seat 133 is flush with the bottom of the tank mount 132. The mounting slot is configured to limit the external power source connection seat 133 to prevent displacement thereof. The bottom of external power source connection seat 133 runs flush with the bottom of the tank mount 132 so that the entire aquarium can be placed flat on a placement table, and the overall aesthetics of the aquarium would also be improved at the same time.

The external power source connection seat 133 includes a protective casing 1335 having a first contact mount 1332 configured for mounting the first conductive contact 131. The external power line 14 extends into inside the protective casing 1335 to be coupled to the first conductive contact 131. A protective hole for the second conductive contact 111 to pass through is defined in the protective casing 1335 at a position corresponding to the first conductive contact 131. The protective hole can protect the external power line 14 and first conductive contact 131 on the external power source connection seat 133, and prevent a user from touching the first conductive contact 131. The protective casing 1335 can also play a dustproof role at the same time.

To prevent the external power line 14 from being disengaged from the first conductive contact 131 due to misoperation on the external power line 14 during use, the protective casing 1335 is further provided with a fixing clamp 1334 inside for fixing the external power line 14 and preventing displacement thereof.

The external power source connection seat 133 further includes a bottom cover plate 1333 which is detachably fixed to the bottom of the protective casing 1335. The bottom cover plate 1333 is detachably connected to the protective casing 1335 through a screw. A side of the protective casing 1335 close to the bottom cover plate 1333 is fixedly provided with a threaded post. The bottom cover plate 1333 is provided with a threaded hole corresponding to the threaded post, and the screw passes through the threaded hole to be screwed into the threaded post for fixedly connecting the bottom cover plate 1333 to the protective casing 1335. Of course, in other embodiments, the bottom cover plate 1333 may also be detachably connected to the protective casing 1335 through a snap structure.

To prevent generation of water vapor in the protective casing 1335, in this embodiment the bottom cover plate 1333 may be provided with a water draining hole 1331 from which water vapor in the external power source connection seat 133 can be discharged. Of course, in other embodiments, the protective casing 1335 may also be provided with the water draining hole 1331.

It is to be noted that, in this embodiment, the electric device 12 is a light fixture that includes a light emitting diode (LED) wick and a fixture housing. The LED wick is mounted on the fixture housing. In other embodiments, the electric device 12 may further be a water pump, a filter, an oxygen supply pump, or another power supply device.

Embodiment 2

As illustrated in FIGS. 3 and 4, an embodiment of the present disclosure provides an aquarium. The aquarium includes a tank 21, an electric device 22 disposed in the tank 21, and a base seat 23 detachably connected to the tank 21. The base seat 23 is provided with a first conductive contact 231 connected to an external power line 24 and the tank 21 is provided with a second conductive contact 211 connected to the electric device 22. When the tank 21 is mounted on the base seat 23, the first conductive contact 231 comes into contact with the second conductive contact 211 to power on the electric device 22.

The first conductive contact 231 is disposed on the base seat 23. When the tank 21 is mounted on the base seat 23, the first conductive contact 231 comes into contact with the second conductive contact 211, such that the electric device 22 is powered up and can work normally. When the tank 21 is detached from the base seat 23, the first conductive contact 231 is separated from the second conductive contact 211, such that the electric device 22 would be powered off and stop working. With this design, when the tank 21 needs to be removed or needs to be moved, cleaned or maintained, the tank 21 is directly detached from the base seat 23, and then the circuitry of the electric device 22 is cut off. This facilitates the cleaning and maintenance. In addition, since the first conductive contact 231 is disposed on the base seat 23, the second conductive contact 211 is disposed on the tank 21, and the first conductive contact 231 is in contact with the second conductive contact 211 to achieve the electrical connection, the connecting wire 252 can avoid being directly pulled from outside the tank 21 to inside the tank 21 to be electrically connected to the electric device 22, thereby avoiding the risk of electric leakage and ensuring the safety of the aquarium. Because the connecting wire 252 is not directly pulled from outside the tank 21 to inside the tank 21, people's view of the pets kept in the aquarium can avoid being blocked by the connecting wire 252, thereby improving the overall aesthetics of the aquarium.

The base seat 23 includes a tank mount 232 and an external power source connection seat 232 connected to the tank mount 233. The tank mount 232 is configured for placing the tank 21. The first conductive contact 231 is disposed on the external power source connection seat 233 and is coupled to the external power line 24. By providing the tank mount 232, the tank body 21 may be directly placed on the base seat 23, which is convenient for use. Specifically, the periphery of the tank mount 232 is provided with a surrounding plate, and a tank mounting position is formed by the surrounding plate to prevent the tank 21 from being displaced on the base seat 23. By disposing the first conductive contact 231 on the external power source connection seat 233, the first conductive contact 231 is convenient to be fixedly mounted.

The tank 21 includes a tank body 213 and a tank cover 214 which is disposed to cover on the tank body 213, the second conductive contact 211 is disposed on the tank cover 214, and the electric device 22 is mounted on the tank cover 214. The external power source connection seat 233 is disposed on one side of the base seat 23 along a circumference of the base seat 23, and the first conductive contact 231 comes into contact with the second conductive contact 211 when the tank cover 214 is arranged to cover on the tank body 213 mounted on the tank mount 232. The second conductive contact 211 is disposed on the tank cover 214. When water is added into the tank body 213 or when the tank body 213 is cleaned and maintained, the first conductive contact 231 is separated from the second conductive contact 211 while the tank cover 214 is removed, and then the electric device 22 is powered off. While the tank body 213 is covered by the tank cover 214, the second conductive contact 211 is pressed against the first conductive contact 231 due to the gravity of the tank cover 214 and the electric device 22, so that the first conductive contact 231 would come into contact with the second conductive contact 211, such that the electric device 22 is powered on. With this design, the power-off and power-on of the electric device 22 may be controlled by the tank cover 214. This is convenient for operation.

Typically, the electric device 22 is connected to the tank cover 214 through a connecting member 25, the connecting member 25 includes a connecting tube 251 and a connecting wire 252 disposed in the connecting tube 251, and the connecting wire 252 has one end connected to the electric device 22 and another end connected to the second conductive contact 211. The connecting tube 251 is provided with a second contact mount 212 for mounting the second conductive contact 211.

The external power source connection seat 233 includes a protective casing 2335 having a first contact mount 2332 for mounting the first conductive contact 231. The external power line 24 extends into inside the protective casing 2335 to be coupled to the first conductive contact 231. A protective hole for the second conductive contact 211 to pass through is defined in the protective casing 2335 at a position corresponding to the first conductive contact 231. The protective hole can protect the external power line 24 and first conductive contact 231 on the external power source connection seat 233, and prevent a user from touching the first conductive contact 231. The protective casing 2335 can also play a dustproof role at the same time.

To prevent the external power line 24 from being disengaged from the first conductive contact 231 due to misoperation on the external power line 24 during use, the protective casing 2335 has a fixing clamp 2334 inside for fixing the external power line 24 and preventing displacement thereof.

The external power source connection seat 233 further includes a bottom cover plate 2333 which is detachably fixed to the bottom of the protective casing 2335. The bottom cover plate 2333 is detachably connected to the protective casing 2335 through a screw. A side of the protective casing 2335 close to the bottom cover plate 2333 is fixedly provided with a threaded post. The bottom cover plate 2333 is provided with a threaded hole corresponding to the threaded post, and the screw passes through the threaded hole to be screwed into the threaded post for fixedly connecting the bottom cover plate 2333 to the protective casing 2335. Of course, in other embodiments, the bottom cover plate 2333 may also be detachably connected to the protective casing 2335 through a snap structure.

To prevent generation of water vapor in the protective casing 2335, in this embodiment the bottom cover plate 2333 may be provided with a water draining hole 2331 from which water vapor in the external power source connection seat 233 can be discharged. Of course, in other embodiments, the protective casing 2335 may also be provided with the water draining hole 2331.

It is to be noted that, in this embodiment, the electric device 22 is a light fixture that includes a LED wick and a fixture housing. The LED wick is mounted on the fixture housing. In other embodiments, the electric device 22 may further be a water pump, a filter, an oxygen supply pump, or another power supply device.

Embodiment 3

As illustrated in FIGS. 5 to 8, an embodiment of the present disclosure provides an aquarium. The aquarium includes a tank and an electric device 43 detachably connected to the tank. The tank includes a tank body 41 and an external power source connection seat 42 detachably connected to the tank body 41. The external power source connection seat 42 is provided with a first conductive contact 421 electrically coupled to an external power line 44. The electric device 43 is coupled to a second conductive contact 431. When the electric device 43 is connected to the tank, the first conductive contact 421 comes into contact with the second conductive contact 431 to power on the electric device 43.

The external power source connection seat 42 is detachably connected to the tank body 41, and then the tank body 41 can be separately moved. The electric device 43 is detachably connected to the tank, and then the electric device 43 may be separated from the tank. With this design, the tank body 41 can be disconnected from the external power source connection seat 42 and the electric device 43, and can be separately taken out. This facilitates the movement, cleaning or maintenance of the tank body 41. Since the electric device 43 is detachably connected to the tank body 41, the electric device 17 may also be detached from the tank body 41 when the electric device 17 needs to be maintained. This facilitates the maintenance of the electric device 17. Because the first conductive contact 421 is configured to come into contact with the second conductive contact 431 to power on the electric device 17, the electric device 17 can be conveniently controlled. The electric device 17 is turned on by using the first conductive contact 421 and the second conductive contact 431, and then the connecting wire is prevented from being directly pulled from outside the tank body 41 to the electric device 17 to be arranged on the sidewall of the tank body 41 which would otherwise affect the overall aesthetics of the aquarium. In addition, people's view of the pets kept in the tank body 41 can avoid being blocked by the connecting wire.

In this embodiment, the tank further includes a tank cover 45 that is optionally coverable on the tank body 41. The external power source connection seat 42 is disposed on the tank cover 45. The first conductive contact 421 is disposed to face toward the tank body 41. The electric device 17 is connected to a sidewall of the tank body 41 through a first fixing member and extends in the direction of the tank cover 45. The second conductive contact 431 is disposed to face toward the tank cover 45. The first conductive contact 421 comes into contact with the second conductive contact 431 when the tank cover 45 is covered on the tank body 41. The electric device 17 is fixed on the tank body 41 through the first fixing member. Since the first conductive contact 421 is disposed to face toward the tank body 41 and the second conductive contact 431 is disposed to face toward the tank cover 45, when the tank body 41 is covered by the tank cover 45, the first conductive contact 421 is pressed against the second conductive contact 431 due to the gravity of the tank body 41 and the external power source connection seat 42, and then the electric device 43 is powered on. When the tank cover 45 is taken from the tank body 41, the first conductive contact 421 is separated from the second conductive contact 431, such that the electric device 43 is powered off. Therefore, the tank cover 45 may be used to control the contact or separation of the first conductive contact 421 and the second conductive contact 431, and thereby to control the power-on or power-off of the electric device 43. When the tank body 41 needs to be moved, cleaned, and maintained, the tank cover 45 is first removed from the upper portion of the tank body 41 to separate the first conductive contact 421 from the second conductive contact 431, and thus the power-off operation is performed on the electric device 43. Then the electric device 43 after the power-off is detached from the tank body 41, so that the tank body 41 may be separately moved, and the electric device 43 may also be separately moved at the same time, which facilitates the cleaning or maintenance of the tank body 41. Since the electric device 43 is separated from the tank body 41, the electric device 43 is prevented from being damaged by contacting water during the process of cleaning the tank body 41.

The first fixing member includes an insert slot 413 formed on the sidewall of the tank body 41 and an insert plate 434 fixedly connected to the electric device 43. The insert plate 434 has one end connected to the electric device 43 and another end that extends toward the tank body 41 and that is insertable into inside the insert slot 413 thus fixing the electric device 43 onto the tank body 41.

In order to strengthen the connection between the electric device 43 and the tank body 41 and prevent the displacement of the electric device 43 with respect to the tank body 41 during use, the first fixing member further includes a first limiting plate 433 that is connected to the electric device at one end and that extends toward the tank body 41 at another end. The insert plate 434 is spaced apart from the first limiting plate 433. The insert slot 413 is formed on an inner sidewall of the tank body 41. An insertive slot is formed between the insert plate 434 and the first limiting plate 433 to be insertively fitted with the sidewall of the tank body 41. The insert plate 434 is inserted into the insert slot 413, and the sidewall of the tank body 41 corresponding to the insert slot 413 is engaged in the insertive slot to restrict the movement of the electric device 43 with respect to the sidewall that the electric device 43 abuts. The connection structure of the electric device 43 and the tank body 41 is effectively strengthened.

Specifically, a limiting buckle 435 is disposed at an end of the first limiting plate 433 facing away from the electric device 43 and is arranged to face toward the sidewall of the tank body 43, and the sidewall of the tank body 41 is provided with a limiting hole 411 disposed corresponding to a position of the limiting buckle 435. The limiting buckle 435 can be inserted into the limiting hole 411 to be fastened to the sidewall of the tank body 41. The limiting buckle 435 is disposed and used to be engaged with the sidewall of the tank body 41 via the limiting hole 411 so as to limit the first fixing member and thereby to limit the electric device 43.

The first limiting plate 433 is prevented from being disengaged from the sidewall of the tank body 41 during use of the aquarium.

The tank cover 45 abuts the tank body 41 through a cover body limiting member. The cover body limiting member includes a limiting protrusion 412 disposed on the outer sidewall of the tank body 41 and a limiting groove defined in the tank cover 45. The limiting groove has a second guide surface, and the limiting protrusion 412 is inserted into the limiting groove through the second guide surface. By mating the limiting protrusion 412 with the limiting groove, the tank cover is limited on the tank body 41 for preventing the tank cover 45 from being collided during use and thereby preventing displacement between the tank cover 45 and the tank body 41. Then, the first conductive contact 421 is separated from the second conductive contact 431 such that the electric device 43 is powered off. The second guide surface is arranged to facilitate the insertion of the limiting protrusion 412 into the limiting groove. Of course, in other embodiments, the limiting protrusion 412 may further be disposed on the inner sidewall of the tank cover 45, the limiting groove may be disposed on the outer sidewall of the tank body 41, and the tank cover 45 may also be fixed on the tank body 41.

The external power source connection seat 42 includes a protective casing 425 having a first contact mount 422 for mounting the first conductive contact 421. The external power line 44 extends into inside the protective casing 425 to be coupled to the first conductive contact 421. A protective hole 46 for the second conductive contact 431 to pass through is defined in the protective casing 425 at a position corresponding to the first conductive contact 421. The protective hole 46 can protect the external power line 44 and first conductive contact 421 on the external power source connection seat 42, and prevent a user from touching the first conductive contact 421. The protective casing 425 can also play a dustproof role at the same time.

Specifically, the electric device 43 is provided with a second contact mount 432 on which the second conductive contact 431 is disposed.

To prevent the external power line 44 from being disengaged from the first conductive contact 421 due to misoperation on the external power line 44 during use, the protective casing 425 has a fixing clamp 423 inside for fixing the external power line 44 and preventing displacement thereof.

The external power source connection seat 42 further includes a bottom cover plate 424 which is detachably fixed to the bottom of the protective casing 425. The bottom cover plate 424 is detachably connected to the protective casing 425 through a screw. A side of the protective casing 425 close to the bottom cover plate 424 is fixedly provided with a threaded post. The bottom cover plate 424 is provided with a threaded hole corresponding to the threaded post. The screw passes through the threaded hole, is screwed into the threaded post, and then is connected to the bottom cover plate 424. Of course, in other embodiments, the bottom cover plate 424 may also be detachably connected to the protective casing 425 through a snap structure.

To prevent generation of water vapor in the protective casing 425, the bottom cover plate 424 is provided with a water draining hole from which water vapor in the external power source connection seat 42 can be discharged. In other embodiments, the protective casing 425 may be provided with the water draining hole.

It is to be noted that, in the embodiment, the electric device 43 is a light fixture that includes a LED wick and a fixture housing. The LED wick is mounted on the fixture housing. In other embodiments, the electric device 43 may further be a water pump, a filter, an oxygen supply pump, or another power supply device.

Embodiment 4

As illustrated in FIGS. 9 and 10, an embodiment of the present disclosure provides an aquarium. The aquarium includes a tank and an electric device 53 detachably connected to the tank. The tank includes a tank body 51 and an external power source connection seat 52 detachably connected to the tank body 51. The external power source connection seat 52 is provided with a first conductive contact electrically connected to an external power line 54. The electric device 53 is coupled to a second conductive contact 531. When the electric device 53 is coupled to the tank, the first conductive contact comes into contact with the second conductive contact 531, and the electrical connection is turned on.

The external power source connection seat 52 is detachably connected to the tank body 51 or is separated from the tank body 51, and then the tank body 51 may be separately moved. The electric device 53 is detachably connected to the tank, and then the electric device 53 may be separated from the tank. With this design, the tank body 51 can be respectively disconnected from the external power source connection seat 52 and the electric device 53, and can be separately taken out. This facilitates the movement, cleaning or maintenance of the tank body 51. Since the electric device 53 is detachably connected to the tank body 51, the electric device 53 may also be detached from the tank body 51 when the electric device 53 needs to be maintained. This facilitates maintenance of the electric device 53. The first conductive contact is in contact with the second conductive contact 531 to power on the electric device 53, so that the electric device 53 is conveniently controlled. The electric device 53 is turned on by using the first conductive contact and the second conductive contact 531, and then the connecting wire is prevented from being directly pulled from outside the tank body 51 to the electric device 53 to be arranged on the sidewall of the tank body 51 and therefore to affect the overall aesthetics of the aquarium. In addition, people's view of the pets kept in the tank body 51 can avoid being blocked by the connecting wire.

In the embodiment, the external power source connection seat 52 is mounted on the outer sidewall of the tank body 51, and is connected to the electric device 53 and the tank body 51 through a second fixing member. In actual use, in order to facilitate the contact of the first conductive contact with the second conductive contact 531, the distance between the electric device 53 and the external power source connection seat 52 may be shortened as much as possible. Specifically, the external power source connection seat 52 extends to an opening portion adjacent to the tank body 51.

The second fixing member includes a connecting plate 532 fixedly connected to the electric device 53 and second limiting plates 534 respectively connected to the connecting plate 532. The two second limiting plates 534 are disposed on one side of the connecting plate 532 facing away from the electric device 53, and a limiting slot 535 is formed between the two second limiting plates 534. The second conductive contact 531 extends through the connecting plate 532 to a slot bottom of the limiting slot 535 and further protrudes from the slot bottom. The tank body 51 and the external power source connection seat 52 are both snap-fitted in the limiting slot 535, and the first conductive contact is disposed on the external power source connection seat 52. The electric device 53, the tank body 51 and the external power source connection seat 52 can be connected by the second fixing member. The electric device 53 is fixedly connected to the sidewall of the tank body 51 and the external power source connection seat 52 through the limiting slot 535. The first conductive contact comes into contact with the second conductive contact 531 to power on the electric device 53. When the electric device 53 is detached from the tank body 51, the external power source connection seat 52 is also detached from the tank body 51, so that the tank body 51 is respectively separated from the electric device 53 and the external power source connection seat 52. The respective movement or maintenance of the tank body 51, electric device 53, and external power source connection seat 52 is facilitated.

A first clamping hole is defined in one side of the external power source connection seat 52 facing away from the tank body 51. A second clamping hole is defined in the sidewall of the tank body 51 connected to the external power source connection seat 52. A clamp 533 that cooperates with the first clamping hole and the second clamping hole is disposed on one side of the two limiting plates 534 close to the limiting slot 535. The clamp 533 cooperates with the first clamping hole and the second clamping hole, so that the two second limiting plates 534 are respectively engaged with the sidewall of the tank body 51 and the external power source connection seat 52. Thereby the second fixing member is limited, and the connection structure between the electric device 53 and the tank body 51 as well as the external power source connection seat 52 is strengthened.

The external power source connection seat 52 includes a protective casing 521 having a first contact mount for mounting the first conductive contact. The external power line 54 extends into the protective casing 521 to be coupled to the first conductive contact. A protective hole 55 for the second conductive contact 531 to pass through is defined in the protective casing 521 at a position corresponding to the first conductive contact. The protective hole 55 can protect the external power line 54 and first conductive contact on the external power source connection seat 52, and prevent a user from touching the first conductive contact. The protective casing 521 can also play a dustproof role at the same time.

To prevent the external power line 54 from being disengaged from the first conductive contact due to misoperation on the external power line 54 during use, the protective casing 521 has a fixing clamp 523 inside for fixing the external power line 54 and preventing displacement thereof.

The external power source connection seat 52 further includes a bottom cover plate 522 which is detachably fixed to the bottom of the protective casing 521. The bottom cover plate 52 is detachably connected to the protective casing 521 through a screw. A side of the protective casing 521 close to the bottom cover plate 522 is fixedly provided with a threaded post. The bottom cover plate 522 is provided with a threaded hole corresponding to the threaded post. The screw passes through the threaded hole, is screwed into the threaded post, and then is connected to the bottom cover plate 522. Of course, in other embodiments, the bottom cover plate 522 may also be detachably connected to the protective casing 521 through a snap structure.

To prevent generation of water vapor in the protective casing 521, the bottom cover plate 522 may be provided with a water draining hole through which water vapor in the external power source connection seat 52 can be discharged. In other embodiments, the protective casing 521 may be provided with the water draining hole.

It is to be noted that, in this embodiment the electric device 53 is a light fixture that includes a LED wick and a fixture housing. The LED wick is mounted on the fixture housing. In other embodiments, the electric device 53 may further be a water pump, a filter, an oxygen supply pump, or another power supply device.

Embodiment 5

As illustrated in FIGS. 11 and 12, an embodiment of the present disclosure provides an aquarium. The aquarium includes a tank and an electric device 33 detachably connected to the tank. The tank includes a tank body 31 and an external power source connection seat 32 detachably connected to the tank body 31. The external power source connection seat 32 is provided with a first conductive contact 321 electrically coupled to an external power line 34. The electric device 33 is coupled to a second conductive contact 331. When the electric device 33 is connected to the tank, the first conductive contact 321 comes into contact with the second conductive contact 331, and the power is on.

The external power source connection seat 32 is detachably connected to the tank body 31 or is separated from the tank body 31, and then the tank body 31 may be separately moved. The electric device 33 is detachably connected to the tank, and then the electric device 33 may be separated from the tank. With this design, the tank body 31 can be respectively disconnected from the external power source connection seat 32 and the electric device 33, and can be separately taken out. This facilitates the movement, cleaning or maintenance of the tank body 31. Since the electric device 33 is detachably connected to the tank body 31, the electric device 33 may also be detached from the tank body 31 when the electric device 33 needs to be maintained. This facilitates maintenance of the electric device 33. The first conductive contact 321 is in contact with the second conductive contact 331 to power on the electric device 33, so that the electric device 33 is conveniently controlled. The electric device 33 is turned on by using the first conductive contact 321 and the second conductive contact 131, and then the connecting wire is prevented from being directly pulled from outside the tank body 31 to the electric device 33 to be arranged on the sidewall of the tank body 31 and therefore to affect the overall aesthetics of the aquarium. In addition, people's sight of the pets kept in the tank body 31 can avoid being blocked by the connecting wire.

In the embodiment, the tank further includes a base seat 35 detachably connected to the tank body 31. The tank body 31 is detachably mounted on the base seat 35. The external power source connection seat 32 is disposed on one side of the tank body 31 and is connected to the base seat 35. The electric device 33 is detachably fixed to an upper end of the tank body 31 through a third fixing member. An end of the third fixing member facing away from the electric device 33 extends to the external power source connection seat 32. The second conductive contact 331 is disposed at an end of the third fixing member right facing the external power source connection seat 32. The electric device 33 is detachably connected to a sidewall of the tank body 31.

The third fixing member includes a fixing portion 332 connected to the electric device 33. The fixing portion 332 is provided with a insertive slot corresponding to a sidewall of the tank body 31, and the sidewall of the tank body 31 is insertively fitted with the insertive slot. The sidewall of the tank body is inserted into the insertive slot, and the electric device 33 is fixed. The electric device 33 is mated to the sidewall of the tank body 31, and the second conductive contact 331 is mated to the external power source connection seat 32 at the same time. The electric device 33 is powered on.

The external power source connection seat 32 includes a protective casing 324 having a first contact mount 322 for mounting the first conductive contact 321. The external power line 34 extends into the protective casing 324 to be coupled to the first conductive contact 321. A protective hole for the second conductive contact 331 to pass through is defined in the protective casing 324 at a position corresponding to the first conductive contact 321. The protective hole can protect the external power line 34 and first conductive contact 321 on the external power source connection seat 32, and prevent a user from touching the first conductive contact 321. The protective casing 324 can also play a dustproof role at the same time.

In order to strengthen the connection structure of the second conductive contact 331 and the electric device 33, the electric device 33 may be provided with a second contact mount 333.

To prevent the external power line 34 from being disengaged from the first conductive contact 321 due to misoperation on the external power line 34 during use, the protective casing 324 has a fixing clamp 323 inside for fixing the external power line 34 and preventing displacement thereof.

The external power source connection seat 32 further includes a bottom cover plate 325 which is detachably fixed to the bottom of the protective casing 324. The bottom cover plate 325 is detachably connected to the protective casing 324 through a screw. A side of the protective casing 324 close to the bottom cover plate 325 is fixedly provided with a threaded post. The bottom cover plate 325 is provided with a threaded hole corresponding to the threaded post. The screw passes through the threaded hole, is screwed into the threaded post, and then is connected to the bottom cover plate 325. Of course, in other embodiments, the bottom cover plate 325 may also be detachably connected to the protective casing 324 through a snap structure.

To prevent generation of water vapor in the protective casing 324, the bottom cover plate 325 is provided with a water draining hole through which water vapor in the external power source connection seat 32 can be discharged. In other embodiments, the protective casing 324 may be provided with the water draining hole.

It is to be noted that, in the embodiment, the electric device 33 is a light fixture that includes a LED wick and a fixture housing. The LED wick is mounted on the fixture housing. In other embodiments, the electric device 33 may further be a water pump, a filter, an oxygen supply pump, or another power supply device.

Apparently, the above embodiments of the present disclosure are merely illustrative of the present disclosure and are not intended to limit the embodiments of the present disclosure. For those of ordinary skill in the art, alterations or modifications in other different forms can be made based on the above description. Embodiments of the present disclosure cannot be and needn't be exhausted herein. Any modifications, equivalent substitutions and improvements without departing from the spirit and principle of the present disclosure shall all fall in the scope of the claims appended to the present disclosure.

What is claimed is:
1. An aquarium, comprising:
   a tank;
   an electric device connected to the tank;
   a first conductive contact configured to be coupled to an external power source; and
   a second conductive contact coupled to the electric device,
   wherein the electric device is detachably connected to the tank, the tank comprises a tank body and an external power source connection seat detachably connected to the tank body, and the first conductive contact is disposed on the external power source connection seat;
   wherein the tank further comprises a tank cover operative to cover the tank body, the external power source connection seat is disposed on the tank cover, the first conductive contact is disposed to face toward the tank body, the electric device is connected to a sidewall of the tank body through a first fixing member and extends toward the tank cover, the second conductive contact is disposed to face toward the tank cover;
   wherein when the tank body is covered by the tank cover, the first conductive contact comes into contact with the second conductive contact to power up the electric device, and when the tank cover is removed from the tank body, the first conductive contact gets out of contact with the second conductive contact to power off the electric device;
   wherein the first fixing member comprises an insert slot defined in the sidewall of the tank body and an insert plate fixedly connected to the electric device, the insert plate having a first end connected to the electric device and a second end that extends toward the tank body and that is insertable into the insert slot thus fixing the electric device onto the tank body; and
   wherein the first fixing member further comprises a first limiting plate that comprises a first end connected to the electric device and a second end that extends toward the tank body, wherein the insert plate is spaced apart from the first limiting plate, the insert slot is formed on an inner sidewall of the tank body, and the insert plate and the first limiting plate forms an insertive slot configured to be insertively fitted with the sidewall of the tank body.

2. The aquarium of claim 1, further comprising an external power line, wherein the external power source connection seat comprises a protective casing having a first contact mount for mounting the first conductive contact, the external power line extends into inside the protective casing to be coupled to the first conductive contact, and the protective casing is provided with a protective hole configured for the second conductive contact to pass through at a position corresponding to the first conductive contact.

3. The aquarium of claim 1, further comprising an external power line, wherein the external power source connection seat comprises a protective casing having a first contact mount for mounting the first conductive contact, the external power line extends into inside the protective casing to be coupled to the first conductive contact, and the protective casing is provided with a protective hole configured for the second conductive contact to pass through at a position corresponding to the first conductive contact.

4. The aquarium of claim 1, further comprising an external power line, wherein the external power source connection seat comprises a protective casing having a first contact mount for mounting the first conductive contact, the external power line extends into inside the protective casing to be coupled to the first conductive contact, and the protective casing is provided with a protective hole configured for the second conductive contact to pass through at a position corresponding to the first conductive contact.

5. An aquarium, comprising:
a tank;
an electric device connected to the tank;
a first conductive contact configured to be coupled to an external power source; and
a second conductive contact coupled to the electric device,
wherein the first conductive contact is configured to contact the second conductive contact to power up the electric device,
wherein the electric device is detachably connected to the tank, the tank comprises a tank body and an external power source connection seat detachably connected to the tank body, and the first conductive contact is disposed on the external power source connection seat; when the electric device is connected to the tank, the first conductive contact is in contact with the second conductive contact to power up the electric device;
wherein the external power source connection seat is mounted on an outer sidewall of the tank body, and is connected to the electric device and the tank body through a fixing member; and
wherein the fixing member comprises a connecting plate fixedly connected to the electric device and two second limiting plates respectively connected to two ends of the connecting plate, the two second limiting plates being disposed on a side of the connecting plate facing away from the electric device, the two second limiting plates forming a limiting slot therebetween, the second conductive contact extending through the connecting plate to a slot bottom of the limiting slot and protruding from the slot bottom, wherein the tank body and the external power source connection seat are both snap-fitted with the limiting slot, and the first conductive contact is disposed on the external power source connection seat.

6. The aquarium of claim 5, further comprising an external power line, wherein the external power source connection seat comprises a protective casing having a first contact mount for mounting the first conductive contact, the external power line extends into inside the protective casing to be coupled to the first conductive contact, and the protective casing is provided with a protective hole configured for the second conductive contact to pass through at a position corresponding to the first conductive contact.

\* \* \* \* \*